United States Patent
Lee et al.

(10) Patent No.: US 9,999,923 B2
(45) Date of Patent: Jun. 19, 2018

(54) SILVER POWDER

(71) Applicant: TOKUSEN KOGYO CO., LTD., Ono, Hyogo (JP)

(72) Inventors: Woojin Lee, Ono (JP); Shun Wakasaki, Ono (JP); Takayuki Kanamori, Ono (JP); Michiko Kamishima, Ono (JP)

(73) Assignee: TOKUSEN KOGYO CO., LTD., Ono, Hyogo (JP)

( * ) Notice: Subject to any disclaimer, the term of this patent is extended or adjusted under 35 U.S.C. 154(b) by 6 days.

(21) Appl. No.: 15/455,842

(22) Filed: Mar. 10, 2017

(65) Prior Publication Data

US 2017/0333988 A1  Nov. 23, 2017

(30) Foreign Application Priority Data

May 17, 2016 (JP) .................................. 2016-098591

(51) Int. Cl.
*H01B 1/02* (2006.01)
*B22F 1/00* (2006.01)
(Continued)

(52) U.S. Cl.
CPC .............. *B22F 1/02* (2013.01); *B22F 1/0003* (2013.01); *B22F 9/24* (2013.01); *H01B 1/02* (2013.01);
(Continued)

(58) Field of Classification Search
CPC ..... H01B 1/00; H01B 1/02; B22F 1/00; B22F 1/0007; B22F 1/0037
See application file for complete search history.

(56) References Cited

U.S. PATENT DOCUMENTS

| | | | | |
|---|---|---|---|---|
| 9,011,726 B2* | 4/2015 | Nagano | ..................... | H01B 1/22 252/500 |
| 9,109,270 B2* | 8/2015 | Xia | ........................ | B22F 1/0025 |
| 2014/0087265 A1* | 3/2014 | Yura | ..................... | H01M 4/131 429/231.1 |
| 2015/0104625 A1* | 4/2015 | Shiozawa | ............. | B22F 1/0055 428/208 |
| 2016/0001362 A1 | 1/2016 | Lee et al. | | |
| 2016/0082418 A1* | 3/2016 | Qin | ........................ | B22F 1/0025 502/330 |

FOREIGN PATENT DOCUMENTS

| | | |
|---|---|---|
| CN | 101733410 A | 6/2010 |
| JP | 2001-049309 A | 2/2001 |

(Continued)

OTHER PUBLICATIONS

Chen et al "Morphology-controlled synthesis of silver nanostructures . . . ", Nanotechnology 18 (2007) 115612 (8pp). (Year: 2007).*

(Continued)

*Primary Examiner* — Mark Kopec
(74) *Attorney, Agent, or Firm* — Dickinson Wright PLLC (57) ABSTRACT

A silver powder includes a large number of particles. The particles include polyhedral particles 2. The ratio P1 of the number of the polyhedral particles 2 to the total number of the particles is equal to or greater than 80%. Each polyhedral particle 2 has a body containing silver as a main component, and a coating layer covering a surface of the body and containing organic matter as a main component. Each polyhedral particle 2 has an aspect ratio of equal to or less than 3.0. The content P2 of the organic matter in the silver powder is preferably equal to or less than 0.5% by weight. The silver powder preferably has a median diameter D50 of equal to or less than 0.5 μm. The silver powder preferably has a tap density TD of equal to or greater than 5.0 g/cm³.

2 Claims, 11 Drawing Sheets

(51) Int. Cl.
   *B22F 1/02* (2006.01)
   *B22F 9/24* (2006.01)
   *H05K 1/09* (2006.01)

(52) U.S. Cl.
   CPC ........ *H05K 1/097* (2013.01); *B22F 2009/245* (2013.01); *B22F 2301/255* (2013.01); *B22F 2302/45* (2013.01); *B22F 2304/05* (2013.01)

(56) References Cited

FOREIGN PATENT DOCUMENTS

| | | | |
|---|---|---|---|
| JP | 2005267859 A | * | 9/2005 |
| JP | 2007-254845 A | | 10/2007 |
| KR | 20140101210 A | * | 8/2014 |

OTHER PUBLICATIONS

Khodashenas et al "Synthesis of silver nanoparticles with different shapes", Arabiab Journal of Chemistry (2015) 16pp. (Year: 2015).*
Amepox Microelectronis LTD. Silver Semiflake Powder AX10C product data sheet (no pub date) (Year: 2017).*
Chen et al "Silver Nanodisks: Synthesis, Characterization and self-assembly", Journal of Physical Chemistry B, vol. 106, No. 42, Oct. 24, 2002. (Year: 2002).*
Grzelczak et al "Shape control in golf nanoparticle synthesis", Chem. Soc. Rev. 2008, 37, 1783-1791. (Year: 2008).*
Pastoria-Santos et al "Formation of PVP-protected metal nanoparticles in dmf", Langmuir 2002, 18, 2888-2894. (Year: 2002).*
Maillard et al "Tuning the size of silver nanodisks with similar aspect ratios . . . ", J. Phys. Chem. B 2003, 107, 2466-70. (Year: 2003).*
Xia et al "Recent developments in shape-controlled synthesis of silver nanocrystals", Journal of Physical Chemistry C, 2012, 21647-656. (Year: 2012).*
Zou et al "Controlled growth of silver nanopartiCles in a hydrothermal process", China Particuology 5 (2007) 206-212. (Year: 2007).*
Chih-Yu Jao et al, "Thin and Robust Encapsulation of Silver and Gold Nanoparticles with Dithiocarbamate-anchored Polyelectrolytes," Mater. Res. Soc. Symp. Proc., vol. 1348, 2011.
Jixiang Fang et al., "Polyhedral silver mesocages for single particle surface-enhanced Raman scattering-based biosensor," Biomaterials 32 (2011) 4877-4884.
EP Communication for EP Application No. 17159968.1, dated Oct. 6, 2017.

* cited by examiner

SILVER POWDER

This application claims priority on Patent Application No. 2016-98591 filed in JAPAN on May 17, 2016. The entire contents of this Japanese Patent Application are hereby incorporated by reference.

BACKGROUND OF THE INVENTION

Field of the Invention

The present invention relates to silver powders. More particularly, the present invention relates to silver powders which are suitable for applications which require electrical conductivity, such as a printed circuit board and the like.

Description of the Related Art

Electrically conductive paste is used for the production of printed circuit boards for electronic devices. The paste contains an electrically conductive powder, a binder, and a liquid organic compound (solvent). The electrically conductive powder includes a large number of fine particles containing a metal as a main component. The paste is used to print a pattern of wiring which connects electronic components to each other. After the printing, the paste is heated. By the heating, fine metal particles are sintered with fine metal particles adjacent thereto.

As a method for printing such a pattern, screen printing, gravure offset printing, photoetching, and the like are adopted.

In screen printing, the paste is placed over a screen mask on which a pattern has been formed. The screen mask is pressed against a plate by using a squeegee. By the pressing, the pattern is formed on the plate.

In gravure offset printing, grooves formed by etching or the like are filled with the paste, whereby a pattern is obtained. The pattern is transferred to a blanket, and further transferred therefrom to a plate.

In photoetching, the paste is applied to a plate. A photosensitive agent is applied to the paste. A portion of the paste is covered by a mask, and exposure to light is performed. The paste is etched, whereby a pattern is obtained.

In any of the printing methods, paste which allows for printing of narrow lines is desired. In other words, the paste needs to have good printing characteristics. Since the paste is heated, the paste also needs to have good thermal conductivity. Since the pattern is a path for electrons, the paste also needs to have good electrical conductivity.

An electrically conductive powder which is particularly suitable for the paste is silver powder. Silver powder includes a large number of silver particles. The silver particle is generally in the form of a sphere or a flake. In the paste which includes spherical silver powder, the contact area between one particle and another particle is small. Therefore, the electrical conductivity of this paste is not high. In the paste which includes flake-like silver powder, the contact area between one particle and another particle is large. Therefore, in the paste which includes flake-like silver powder, the silver is likely to form an electrically conductive network.

JP2001-49309 discloses a silver powder including a large number of spherical particles which are deposited by a reduction method.

JP2007-254845 discloses flake-like silver particles. The silver particles are formed by processing spherical particles with a bead mill.

JP2014-196527 (US2016/0001362) also discloses flake-like silver particles. The silver particles can be produced by a chemical deposition method.

The silver particles disclosed in JP2007-254845 are obtained by using a bead mill. Therefore, the particles are ill-shaped and have an uneven surface. The electrical conductivity achieved by contact between the particles is not sufficient.

The surfaces of the silver particles disclosed in JP2014-196527 are even and smooth. However, a large amount of organic matter caused by the chemical deposition method adheres to the surfaces of the silver particles.

The organic matter impairs the electrical conductivity. If the organic matter is thermally decomposed during heating of the paste, the electrical conductivity is not impaired. However, pyrolysis requires a high-temperature heating step. The high-temperature heating step causes the board to deteriorate. Furthermore, pyrolysis is normally an oxidation reaction. Therefore, when the heating step needs to be conducted in an inert atmosphere, pyrolysis is unlikely to be achieved.

Furthermore, with the silver powder disclosed in JP2007-254845 or the silver powder disclosed in JP2014-196527, the silver particles are irregularly arranged in some parts of the paste after printing. In these parts, voids are likely to occur after sintering. The voids impair the electrical conductivity of the pattern. The voids also impair the adhesion of the pattern.

It is an object of the present invention to provide a silver powder having good electrical conductivity.

SUMMARY OF THE INVENTION

A silver powder according to the present invention includes a large number of particles. Each particle has a body containing silver as a main component, and a coating layer covering a surface of the body and containing organic matter as a main component. The particles include polyhedral particles having an aspect ratio of equal to or less than 3.0. A ratio P1 of a number of the polyhedral particles to a total number of the particles is equal to or greater than 80%.

The silver powder according to the present invention includes polyhedral particles. Each polyhedral particle has a large number of faces. A face of one polyhedral particle is in contact with a face of another polyhedral particle adjacent thereto, whereby a large contact area is achieved. Since each polyhedral particle has an aspect ratio of equal to or less than 3.0, the polyhedral particle has a small specific surface area. Therefore, the amount of the coating layer including the organic matter is small. With the silver powder, impairment of electrical conductivity due to the organic matter is unlikely to occur. Since the silver powder includes a large number of polyhedral particles, voids are unlikely to occur. With the silver powder, impairment of electrical conductivity due to voids is unlikely to occur.

A content P2 of the organic matter is preferably equal to or less than 0.5% by weight. The silver powder preferably has a median diameter D50 of equal to or less than 0.5 μm. The silver powder preferably has a tap density TD of equal to or greater than 5.0 g/cm$^3$.

DESCRIPTION OF THE PREFERRED EMBODIMENTS

The following will describe in detail the present invention on the basis of preferred embodiments with reference to the accompanying drawings.

Figure 1:
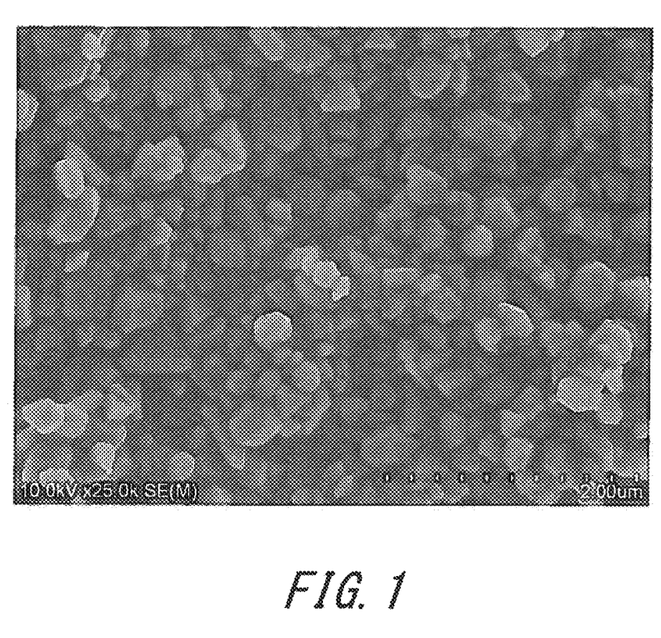
FIG. 1 is a microscope photograph showing a silver powder according to an embodiment of the present invention.
Figure 2:
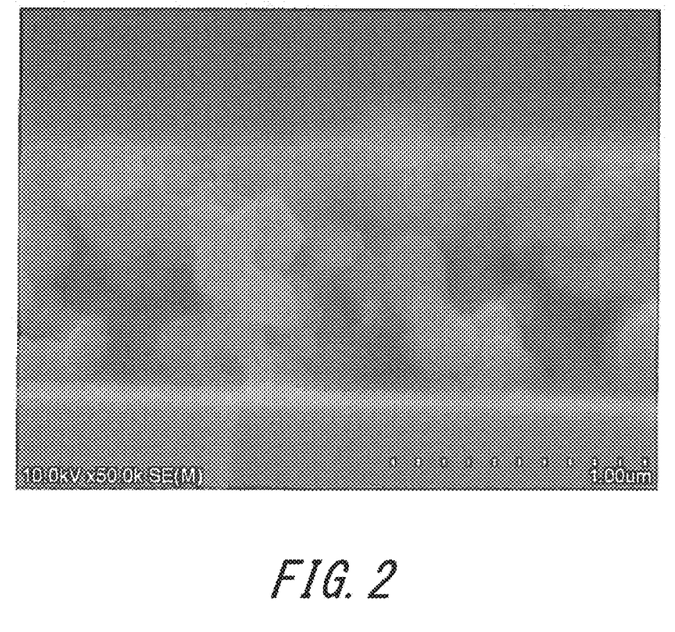
FIG. 2 is a microscope photograph showing a cross-section of the silver powder of FIG. 1.

As shown in FIGS. 1 and 2, a silver powder according to the present invention includes a large number of particles. The particles include polyhedral particles. The particles can further include other particles in addition to the polyhedral particles. Examples of the particles other than the polyhedral particles include flake-like particles and spherical particles.

Figure 3:
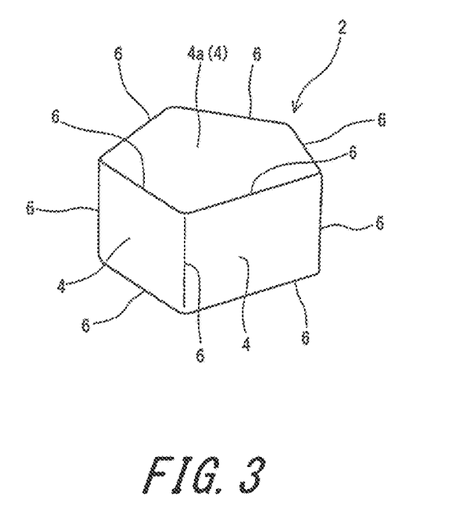
FIG. 3 is a perspective view showing a polyhedral particle included in the silver powder of FIG. 1.
Figure 4:
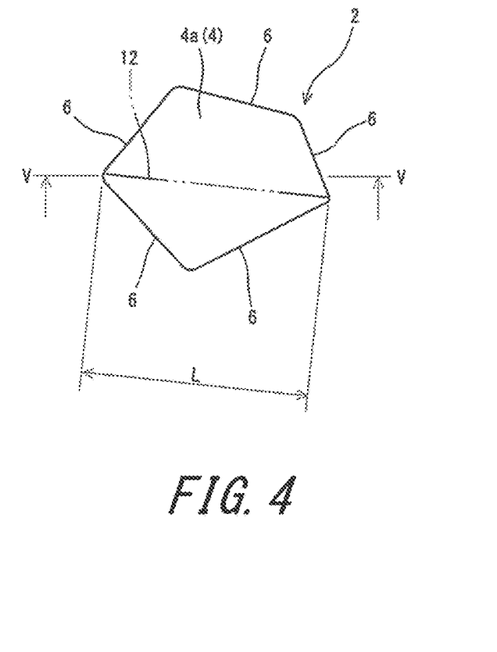
FIG. 4 is a plan view showing the polyhedral particle of FIG. 3.
Figure 5:
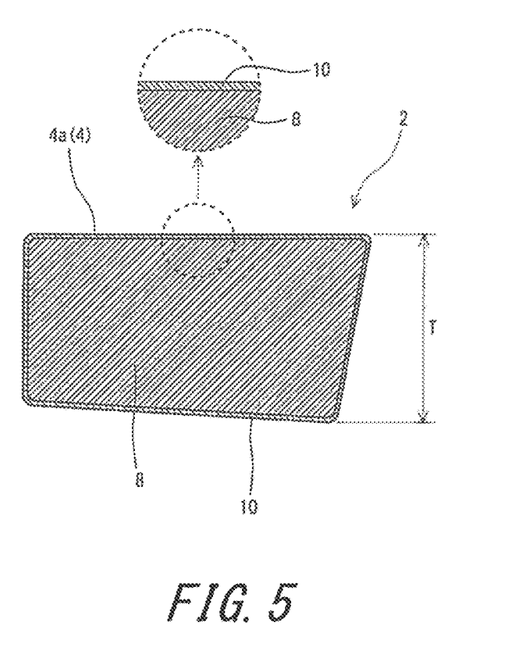
FIG. 5 is an enlarged cross-sectional view taken along line V-V of FIG. 4.

FIGS. 3 to 5 show a polyhedral particle 2. The polyhedral particle 2 has a plurality of faces 4. Each face 4 is substantially a flat surface. The boundary between one flat face 4 and another flat face 4 adjacent thereto is an edge 6 of the polyhedron. Each edge 6 is substantially a straight line.

As shown in FIG. 5, the polyhedral particle 2 has a body 8, and a coating layer 10 covering the surface of the body 8. The coating layer 10 is bonded to the body 8. The bond is any of a chemical bond, an electrical bond, and a covalent bond. The coating layer 10 has a considerably thin thickness. The particles included in the silver powder other than the polyhedral particles 2 similarly have a body and a coating layer.

The body 8 contains silver as a main component, and the remainder of the body 8 is preferably inevitable impurities. Silver has good electrical conductivity. Therefore, the silver powder according to the present invention can be used in various electrically conductive articles. The coating layer 10 contains organic matter as a main component. The coating layer 10 is inevitably formed during production of the silver powder. Since the coating layer 10 is inferior in electrical conductivity to the body 8, the conditions for production of the silver powder are adjusted so that the formation of the coating layer 10 is substantially minimized.

A typical application of the silver powder is electrically conductive paste. Electrically conductive paste is obtained by mixing the silver powder with a solvent. The paste can contain a binder, a dispersant, and the like. The paste can be used to print a pattern on a plate. Examples of a typical printing method include the above-described etching method, a squeegee method, and an inkjet method.

The silver powder includes the polyhedral particles 2. Therefore, in the paste after the printing, a flat face 4 of one polyhedral particle 2 is in contact with a flat face 4 of another polyhedral particle 2 adjacent thereto. In this case, the contact area is large. Therefore, in the paste, the thermal conductivity is high during heating. The paste can be successfully sintered by heating for a short time. During the heating for a short time, electronic components and a substrate are unlikely to be damaged. The paste can be successfully sintered by heating at low temperature. During the heating at low temperature, electronic components and a substrate are unlikely to be damaged.

The contact area between the polyhedral particles 2 is large, and therefore, a pattern obtained from the paste easily conducts electricity. The silver powder contributes to the electrical conductivity of the pattern. In addition, the silver powder also contributes to the adhesiveness of the pattern.

In FIGS. 3 to 5, a reference sign 4a indicates the flat face 4 having the largest area among the flat faces 4 of the polyhedral particle 2. In FIG. 4, a dash-dot-dot line indicated by a reference sign 12 is a line segment that is the longest among all line segments that can be drawn on the flat face 4a. A reference sign L indicates the length of the line segment 12. The identification of the flat face 4a having the largest area, the identification of the line segment 12, and the measurement of the length L are visually performed on the basis of an SEM photograph.

In FIG. 5, a reference sign T indicates the thickness of the polyhedral particle 2. The thickness T can be measured in a direction perpendicular to the flat face 4a. The measurement of the thickness T is visually performed on the basis of an SEM photograph.

The aspect ratio of each polyhedral particle 2 is represented by the ratio (L/T) of the length L to the thickness T. Each polyhedral particle 2 included in the silver powder according to the present invention has a feature that the aspect ratio (L/T) is equal to or less than 3.0. Conventional flake-like particles have an aspect ratio of equal to or greater than 5.0.

A pattern obtained from the silver powder including a large number of the polyhedral particles 2 have less voids than a pattern obtained from a silver powder including only flake-like particles. Also from this standpoint, the polyhedral particles 2 can contribute to the electrical conductivity of the pattern.

In the silver powder, the ratio P1 of the number of the polyhedral particles 2 to the total number of the particles is preferably equal to or greater than 80%. The silver powder having a ratio P1 of equal to or greater than 80% contributes to the electrical conductivity of a pattern or the like. From this standpoint, the ratio P1 is more preferably equal to or greater than 85% and particularly preferably equal to or greater than 90%. The ratio P1 is ideally 100%.

As described above, the coating layer 10 contains organic matter as a main component. The organic matter has a much higher electrical resistance value than that of silver. The content P2 of the organic matter in the silver powder is preferably equal to or less than 0.5% by weight. In a pattern for which the silver powder having a content P2 of equal to or less than 0.5% by weight is used, the electrical conductivity is unlikely to be impaired by the organic matter. Since the content of the organic matter is low, the temperature for sintering the pattern may be low. Furthermore, this sintering can be performed even in an active atmosphere. From these standpoints, the content P2 is more preferably equal to or less than 0.4% by weight, particularly preferably equal to or less than 0.3% by weight.

The silver powder preferably has a median diameter D50 of equal to or less than 0.5 μm. Paste including the silver powder having a median diameter D50 of equal to or less than 0.5 μm is suitable for printing of a fine pattern. In addition, the paste is sufficiently sintered at low temperature. From these standpoints, the median diameter D50 is more preferably equal to or less than 0.4 μm and particularly preferably equal to or less than 0.3 μm. The median diameter D50 is preferably equal to or greater than 0.1 μm in light of rheological characteristics of the silver powder and in light of reduction of the organic matter.

In measurement of the median diameter D50, a cumulative curve of the silver powder is determined by a laser diffraction/scattering particle-size distribution measurement method. The cumulative curve is determined by using a laser diffraction/scattering particle-size distribution meter (LA-950V2, manufactured by HORIBA, Ltd.). A particle size at a cumulative volume of 50% on the cumulative curve is obtained as the median diameter D50. The measurement is conducted under the following conditions.

Mode: scattering, wet (water)
Laser light: 80-90%
LED light: 70-90%

The silver powder preferably has a tap density TD of equal to or greater than 5.0 g/cm³. When the silver powder having a tap density TD of equal to or greater than 5.0 g/cm³ is used, occurrence of voids is inhibited in a pattern. Such a pattern has good electrical conductivity. From this standpoint, the tap density TD is more preferably equal to or greater than 5.5 g/cm³ and particularly preferably equal to or greater than 6.0 g/cm³. The tap density TD is measured in accordance with the standards of "JIS Z 2512: 2012."

Each polyhedral particle 2 is preferably monocrystalline. In this case, the polyhedral particle 2 has a smooth surface. This polyhedral particle 2 has good printing characteristics, electrical conductivity, and thermal conductivity. EBSP can be used to confirm that the polyhedral particle 2 is monocrystalline. If the result of EBSP analysis shows that only one color is observed in the polyhedral particle 2, it is determined that the polyhedral particle 2 is monocrystalline. The particles included in the silver powder other than the polyhedral particles 2 are also preferably monocrystalline.

The following will describe an example of a method for producing the silver powder. In the production method, an aqueous solution of silver nitrate is mixed with an aqueous solution of oxalic acid to form silver oxalate. The silver oxalate is dispersed in a carrier to obtain a dispersion. The carrier is a hydrophilic liquid. Specific examples of the carrier which is preferable include water and alcohol. The silver oxalate is dispersed in the carrier by using a dispersant. Glycol dispersants, such as polyethylene glycol and the like, are preferable. By using such a dispersant, the polyhedral particles 2 can be formed. The dispersion is mixed with an amine additive. The amine additive accelerates nucleation of the particles. The addition of the amine additive can reduce the amount of the dispersant. Therefore, the formation of the coating layer 10 caused by the dispersant is inhibited. The amine additive sharpens the particle-size distribution of the silver powder, and inhibits growth of a particle caused by bonding the particles to each other.

The dispersion is heated while being stirred. The stirring speed is preferably 100 rpm. The temperature of the dispersion is preferably equal to or higher than 100° C. but equal to or lower than 150° C. The stirring and heating cause a reaction represented by the following formula. In other words, the silver oxalate is decomposed by heat.

In the dispersion, silver is deposited in the form of particles. An organic compound derived from the silver oxalate, the carrier, or the dispersant adheres to the surfaces of the silver particles. The organic compound is chemically bonded to the silver particles. In other words, the particles include the silver and the organic compound.

Thus, the polyhedral particles 2 in the silver powder according to the present invention are obtained by chemical deposition. Therefore, the surfaces of the polyhedral particles 2 are even and smooth compared to the surfaces of particles obtained using a mill. The polyhedral particles 2 contribute to the electrical conductivity.

Electrically conductive paste is obtained by mixing a solvent, a binder, and the like with the silver powder according to the present invention. Examples of the solvent include: alcohols such as lower alcohols, aliphatic alcohols, alicyclic alcohols, aromatic-aliphatic alcohols, and polyhydric alcohols; glycol ethers such as (poly)alkylene glycol monoalkyl ethers and (poly)alkylene glycol monoaryl ethers; glycol esters such as (poly)alkylene glycol acetates; glycol ether esters such as (poly)alkylene glycol monoalkyl ether acetates; hydrocarbons such as aliphatic hydrocarbons and aromatic hydrocarbons; esters; ethers such as tetrahydrofuran and diethyl ether; and amides such as dimethyl formamide (DMF), dimethyl acetamide (DMAC), and N-methyl-2-pyrrolidone (NMP). Two or more solvents may be used in combination.

EXAMPLES

Example 1

Fifty grams of silver nitrate was dissolved in 1 L of distilled water to obtain a first solution. Meanwhile, 22.2 g of oxalic acid was dissolved in 1 L of distilled water to obtain a second solution. The first solution was mixed with the second solution to obtain a mixture solution containing silver oxalate. Impurities were removed from the mixture solution. To 1 L of the mixture solution, 0.1 g of polyethylene glycol (dispersant) and 3.5 g of triethylamine were added, followed by stirring for 30 min. As a result, the silver oxalate was dispersed. The dispersion was placed in an autoclave. The dispersion was heated to 120° C. while being stirred at a speed of 150 rpm. The stirring was continued at that temperature for 30 min to obtain a liquid containing a silver powder.

Examples 2 and 3 and Comparative Example 4

Liquids containing a silver powder were obtained in the same manner as Example 1, except the ratio P1 and the like were set as shown in Tables 1 and 2 below.

Comparative Example 1

A liquid containing silver flakes was obtained in the same manner as Example 1, except the amount of the additive, the stirring speed, and the reaction speed were changed.

Comparative Example 2

A spherical silver powder was obtained by a reduction method.

Comparative Example 3

Spherical fine particles of silver were processed into flakes by using a ball mill.

[Evaluation of Electrical Conductivity]

Electrically conductive paste was obtained by mixing the silver powder, a solvent, a binder, and a dispersant. The electrically conductive paste was used to print wiring. The wiring was sintered by heating the wiring in the atmosphere at a temperature of 140° C. for 30 min. The electrical resistivity of the wiring was measured. The results are shown in Tables 1 and 2 below.

TABLE 1

| | Results of Evaluation | | |
|---|---|---|---|
| | Example 1 | Example 2 | Example 3 |
| Plan view | FIG. 1 | — | — |
| Cross-sectional view | FIG. 2 | — | — |
| Properties | Silver powder containing polyhedral particles | Silver powder containing polyhedral particles | Silver powder containing polyhedral particles |
| Production method | Deposition | Deposition | Deposition |
| P1 (%) | 96 | 82 | 87 |
| P2 (%) | 0.28 | 0.25 | 0.30 |
| D10 (μm) | 0.17 | 0.21 | 0.19 |
| D50 (μm) | 0.27 | 0.33 | 0.28 |
| D90 (μm) | 0.44 | 0.53 | 0.49 |
| TD (g/cm³) | 6.5 | 5.5 | 6.1 |
| Electrical resistivity (μΩ · cm) | 5.6 | 9.6 | 7.9 |

TABLE 2

Figure 6:
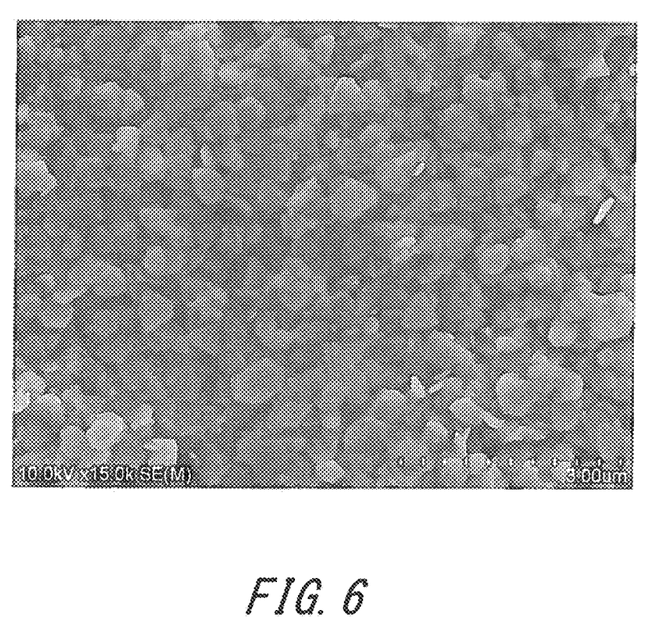
FIG. 6 is a microscope photograph showing a silver powder according to Comparative Example 1.
Figure 7:
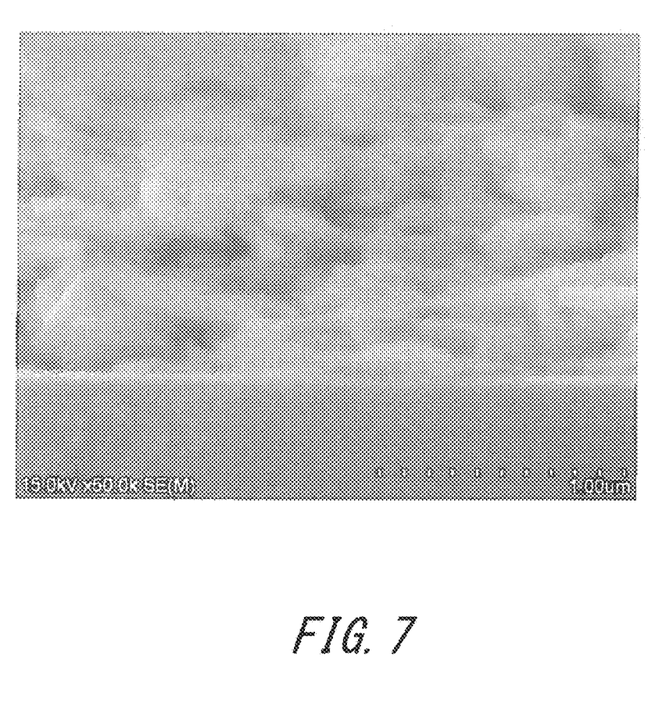
FIG. 7 is a microscope photograph showing a cross-section of the silver powder of FIG. 6.
Figure 8:
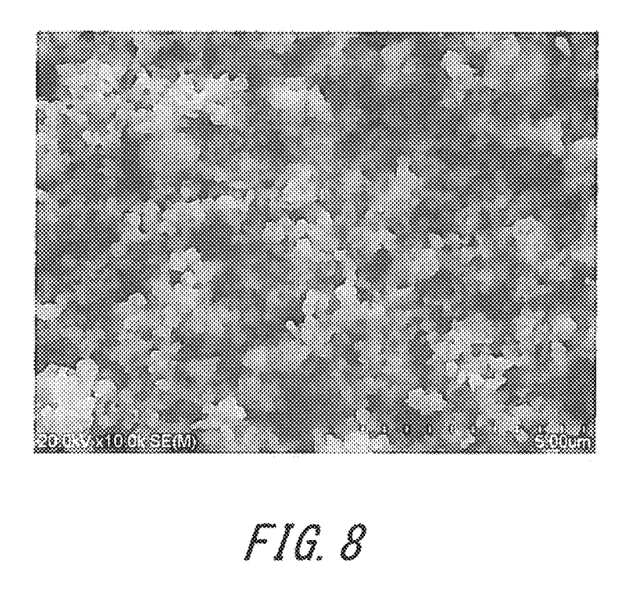
FIG. 8 is a microscope photograph showing a silver powder according to Comparative Example 2.
Figure 9:
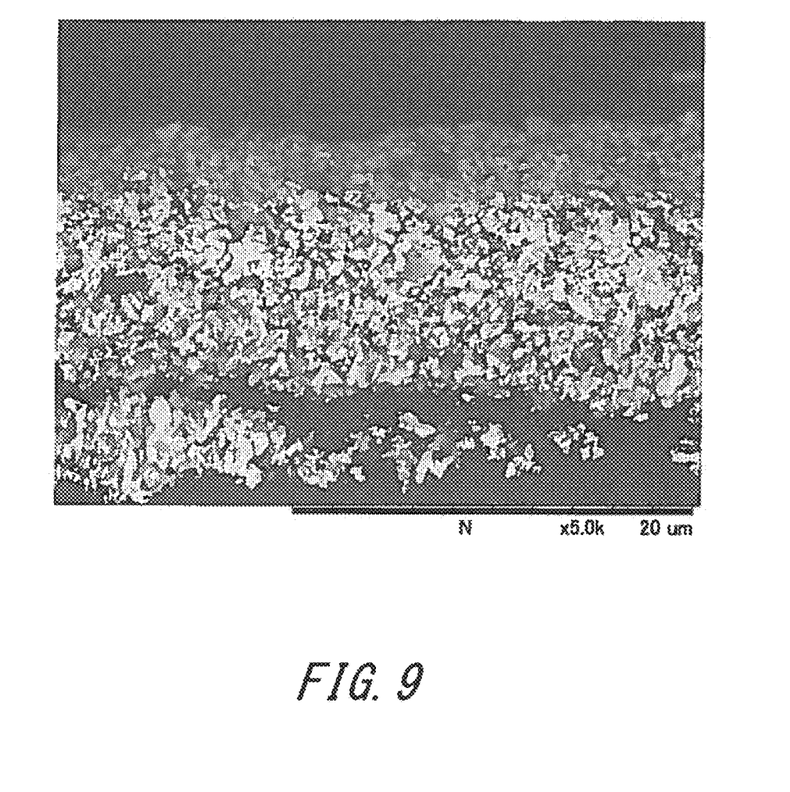
FIG. 9 is a microscope photograph showing a cross-section of the silver powder of FIG. 8.
Figure 10:
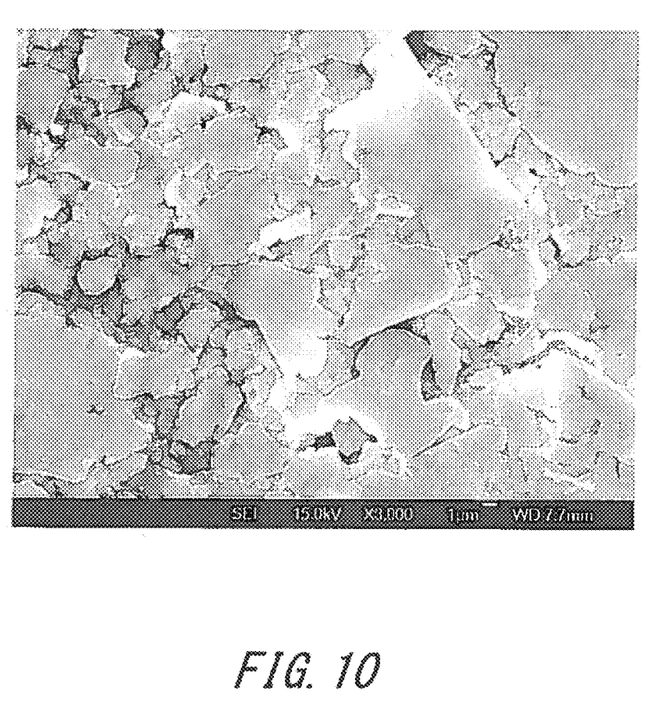
FIG. 10 is a microscope photograph showing a silver powder according to Comparative Example 3.
Figure 11:
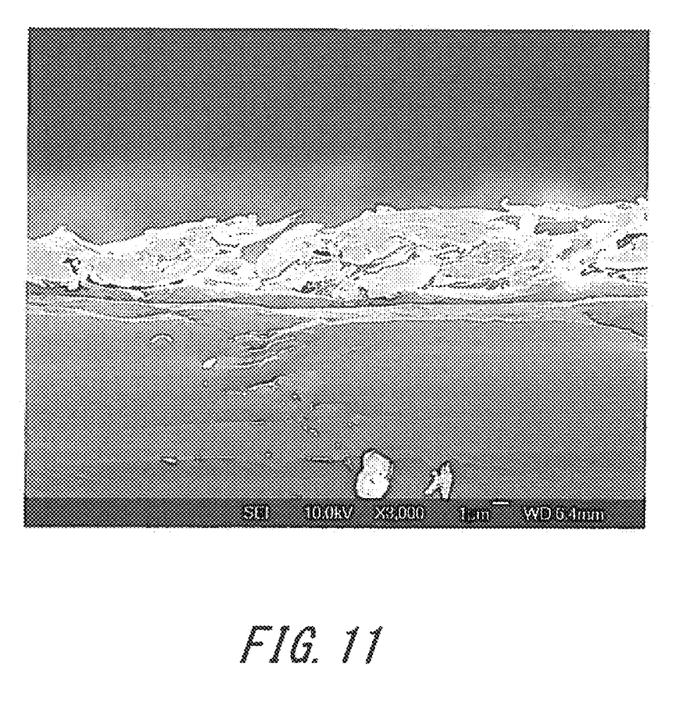
FIG. 11 is a microscope photograph showing a cross-section of the silver powder of FIG. 10.

| | Results of Evaluation | | | |
|---|---|---|---|---|
| | Compara. Example 1 | Compara. Example 2 | Compara. Example 3 | Compara. Example 4 |
| Plan view | FIG. 6 | FIG. 8 | FIG. 10 | — |
| Cross-sectional view | FIG. 7 | FIG. 9 | FIG. 11 | — |
| Properties | Silver flakes | Spherical silver powder | Silver flakes | Silver powder containing polyhedral particles |

TABLE 2-continued

| | Results of Evaluation | | | |
|---|---|---|---|---|
| | Compara. Example 1 | Compara. Example 2 | Compara. Example 3 | Compara. Example 4 |
| Production method | Deposition | Reduction | Mill | Deposition |
| P1 (%) | ≤1 | ≤5 | ≤1 | 61 |
| P2 (%) | 1.20 | 0.87 | 4.75 | 0.80 |
| D10 (μm) | 0.20 | 0.76 | 8.50 | 0.23 |
| D50 (μm) | 0.33 | 1.22 | 15.65 | 0.35 |
| D90 (μm) | 0.57 | 2.28 | 28.76 | 0.61 |
| TD (g/cm³) | 3.4 | 4.3 | 2.2 | 4.1 |
| Electrical resistivity (μΩ · cm) | 20.2 | 146.1 | 194.8 | 14.3 |

As shown in Tables 1 and 2, the wiring obtained from the silver powders of the examples has good electrical conductivity. From the results of evaluation, advantages of the present invention are clear.

The silver powder according to the present invention can be used in paste for printed circuits, paste for electromagnetic wave shield films, paste for electrically conductive adhesives, paste for die bonding, and the like. The above descriptions are merely illustrative examples, and various modifications can be made without departing from the principles of the present invention.

What is claimed is:

1. A silver powder comprising a large number of particles, wherein
   each particle has a body containing silver as a main component, and a coating layer covering a surface of the body and containing organic matter as a main component,
   the particles include polyhedral particles having an aspect ratio of equal to or less than 3.0,
   a ratio P1 of a number of the polyhedral particles to a total number of the particles is equal to or greater than 80%; and
   the silver powder having a median diameter D50 of equal to or greater than 0.1 μm but equal to or less than 0.5 μm, and a tap density TD equal to or greater than 5.0 g/cm³.

2. The silver powder according to claim 1, wherein a content P2 of the organic matter is equal to or less than 0.5% by weight.

* * * * *